(12) United States Patent
Hu et al.

(10) Patent No.: US 11,562,704 B2
(45) Date of Patent: Jan. 24, 2023

(54) ELECTRONIC TAG AND OPERATION METHOD THEREOF

(71) Applicant: BOE TECHNOLOGY GROUP CO., LTD., Beijing (CN)

(72) Inventors: Kejun Hu, Beijing (CN); Tao Li, Beijing (CN); Xinyi Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 121 days.

(21) Appl. No.: 17/040,925

(22) PCT Filed: Jan. 4, 2019

(86) PCT No.: PCT/CN2019/070326
§ 371 (c)(1),
(2) Date: Sep. 23, 2020

(87) PCT Pub. No.: WO2019/179211
PCT Pub. Date: Sep. 26, 2019

(65) Prior Publication Data
US 2021/0035509 A1   Feb. 4, 2021

(30) Foreign Application Priority Data

Mar. 23, 2018   (CN) .......................... 201810249774.6

(51) Int. Cl.
G09G 3/34        (2006.01)
G06F 1/20        (2006.01)
(Continued)

(52) U.S. Cl.
CPC ........... G09G 3/3433 (2013.01); G06F 1/206 (2013.01); G06F 1/28 (2013.01); G08B 5/36 (2013.01);
(Continued)

(58) Field of Classification Search
None
See application file for complete search history.

(56) References Cited

U.S. PATENT DOCUMENTS

2011/0050545 A1*  3/2011  Namm .................. G09G 3/20
                                              345/5
2014/0291405 A1   10/2014  Harkes
(Continued)

FOREIGN PATENT DOCUMENTS

CN       101160038 A       4/2008
CN       202736421 U       2/2013
(Continued)

OTHER PUBLICATIONS

Decision of Rejection dated Jul. 2, 2020 in counterpart CN Patent Application No. 201810249774.6, 16 pages.
(Continued)

Primary Examiner — Andre L Matthews
(74) Attorney, Agent, or Firm — Procopio, Cory, Hargreaves & Savitch LLP

(57) ABSTRACT

An electronic tag includes an electronic tag body. The electronic tag body includes a housing, a display screen configured to display information, and a sensor and a main controller that are disposed inside the housing. The sensor is configured to detect an ambient temperature of an environment in which the electronic tag body is located. The main controller is configured to shut off power supplied to the display screen in response to the ambient temperature detected by the sensor being beyond an operating temperature range of the display screen.

18 Claims, 7 Drawing Sheets

(51) Int. Cl.
 *G06F 1/28* (2006.01)
 *G08B 5/36* (2006.01)
 *G08B 21/18* (2006.01)
 *H05K 7/20* (2006.01)

(52) U.S. Cl.
 CPC ....... *G08B 21/182* (2013.01); *H05K 7/20972* (2013.01); *G09G 2330/021* (2013.01); *G09G 2330/045* (2013.01)

(56) References Cited

U.S. PATENT DOCUMENTS

| | | | |
|---|---|---|---|
| 2017/0059920 | A1* | 3/2017 | Nakazawa ........... G09G 3/3406 |
| 2018/0276690 | A1* | 9/2018 | Sequeira ............ G06Q 30/0202 |

FOREIGN PATENT DOCUMENTS

| | | |
|---|---|---|
| CN | 102982367 A | 3/2013 |
| CN | 103324965 A | 9/2013 |
| CN | 204020712 U | 12/2014 |
| CN | 204557535 U | 8/2015 |
| CN | 105046310 A | 11/2015 |
| CN | 204991045 U | 1/2016 |
| CN | 106408076 A | 2/2017 |
| CN | 106845603 A | 6/2017 |
| CN | 206833483 U | 1/2018 |
| CN | 206849428 U | 1/2018 |
| EP | 2742502 A | 6/2014 |
| JP | 200431783 A | 1/2004 |
| JP | 2014516175 A | 7/2014 |

OTHER PUBLICATIONS

Office Action dated Oct. 8, 2019 in counterpart CN Patent Application No. 201810249774.6, 22 pages.

Office Action dated May 8, 2020 in counterpart CN Patent Application No. 201810249774.6, 15 pages.

Electronic circuit set, nickel-cadmium battery charger, Dec. 31, 1987, pp. 4-7 (Cited in corresponding CN Patent application Office Action).

Telecom summary, Sep. 30, 1995, pp. 265-268 (Cited in corresponding CN Patent application Office Action).

* cited by examiner

ELECTRONIC TAG AND OPERATION METHOD THEREOF

CROSS-REFERENCE TO RELATED APPLICATIONS

This application is a national phase entry under 35 USC 371 of International Patent Application No. PCT/CN2019/070326 filed on Apr. 1, 2019, which claims priority to and the benefit of Chinese Patent Application No. 201810249774.6, filed with China National Intellectual Property Administration on Mar. 23, 2018, titled "AN ELECTRONIC TAG AND CONTROL METHOD THEREOF", which are incorporated herein by reference in their entirety.

TECHNICAL FIELD

The present disclosure relates to the technical field of electronic tag technologies, and in particular, to an electronic tag and an operation method thereof.

BACKGROUND

An electronic tag is a tag for updating and displaying the content of the tag through an electronic display device. At present, the electronic tags are widely used in indoor environments such as shopping malls and supermarkets. Compared with traditional sticking paper tags, the electronic tags are more and more popular owing to the advantages of easy replacement, environmental protection, and attractive appearance and the like.

SUMMARY

In a first aspect, an electronic tag is provided. The electronic tag includes an electronic tag body. The electronic tag body includes a housing, a display screen configured to display information, and a sensor and a main controller that are disposed in the housing. The sensor is configured to detect an ambient temperature of an environment in which the electronic tag body is located. The main controller is configured to shut off power supplied to the display screen in response to the ambient temperature detected by the sensor being beyond an operating temperature range of the display screen.

In some embodiments of the present disclosure, the electronic tag body further includes a heat dissipation device disposed in the housing. The main controller is further configured to turn on the heat dissipation device in response to the ambient temperature being higher than a maximum value of a storage temperature range of the display screen, so as to cool down the display screen, until the ambient temperature drops to a preset temperature lower than or equal to the maximum value of the storage temperature range; and turn off the heat dissipation device.

In some embodiments of the present disclosure, the electronic tag further includes a mounting base and a bendable connecting rod. One end of the bendable connecting rod is fixedly connected to the mounting base, and another end of the bendable connecting rod is fixedly connected to the electronic tag body.

In some embodiments of the present disclosure, the electronic tag further includes a power supply configured to supply power to the electronic tag body. The power supply includes a solar panel, a charging circuit, a lithium-ion battery, and a DC-DC converter. The solar panel is connected to the lithium-ion battery through the charging circuit. Each of the solar panel and the lithium-ion battery is connected to an input terminal of the DC-DC converter through a diode.

In some embodiments of the present disclosure, the solar panel is disposed on the mounting base. The charging circuit, the lithium-ion battery and the DC-DC converter are disposed in the housing.

In some embodiments of the present disclosure, the electronic tag further includes a switch circuit. The main controller is configured to control the power supply to supply power to the display screen through the switch circuit. Or, the main controller is configured to control the power supply to supply power to the heat dissipation device through the switch circuit. Or, the main controller is configured to control the power supply to supply power to the display screen and the heat dissipation device through the switch circuit.

In some embodiments of the present disclosure, the electronic tag body further includes a transceiver and a flash memory that are disposed in the housing. The transceiver is configured to communicate with a communication host to obtain display information sent by the communication host. The flash memory is at least configured to store the display information sent by the communication host. The display screen is configured to display information obtained from the flash memory under control of the main controller.

In some embodiments of the present disclosure, the transceiver is a Bluetooth transceiver. The Bluetooth transceiver is integrated in the main controller.

In some embodiments of the present disclosure, the display screen is an electronic paper display screen.

In some embodiments of the present disclosure, the electronic tag body further includes a clock circuit disposed in the housing. The main controller is further configured to control the electronic tag body to enter a sleep state, and wake up the electronic tag body periodically through the clock circuit after the electronic tag body enters the sleep state, so that the electronic tag body is in a normal working state.

In some embodiments of the present disclosure, the electronic tag further includes an activation button. The main controller is further configured to wake up the electronic tag body from the sleep state after the activation button is pressed.

In some embodiments of the present disclosure, the electronic tag further includes at least one indicator light. Each indicator light is connected to the main controller and is configured to perform at least one operation of temperature alarm, power alarm and deep sleep state prompt under control of the main controller.

In some embodiments of the present disclosure, the sensor is a temperature and humidity sensor.

In a second aspect, an operation method of the electronic tag is provided. The operation method includes: detecting, by the sensor, the ambient temperature; and shutting off, by the main controller, power supplied to the display screen in response to the ambient temperature being beyond the operating temperature range of the display screen.

In some embodiments of the present disclosure, in response to the ambient temperature being higher than a maximum value of a storage temperature range of the display screen, the main controller controls the heat dissipation device to be turned on to cool down the display screen. Upon the ambient temperature drops to a preset temperature lower than or equal to the maximum value of the storage temperature range, the main controller turns off the heat dissipation device.

In some embodiments of the present disclosure, the operation method of the electronic tag further includes: receiving, by the transceiver, display information sent by a communication host; storing, by the flash memory, at least latest display information sent by the communication host; and displaying, by the display screen, the stored latest display information obtained from the flash memory.

In some embodiments of the present disclosure, the operation method of the electronic tag further includes: performing an initialization, by the main controller, on the electronic tag after the electronic tag is powered. In a case where the display screen is an electronic paper display screen, the initialization includes performing an initialization on the display screen. Performing the initialization on the display screen includes: detecting, the main controller, whether there is display information stored in the flash memory; controlling, by the main controller, the power supply to stop supplying power to the display screen if there is no display information stored in the flash memory; and otherwise, obtaining, by the main controller, the display information from the flash memory; writing, by the main controller, the display information into a video memory of the display screen for display; and controlling, by the main controller, the power supply to stop supplying power to the display screen after the display screen perform a normal display.

In some embodiments of the present disclosure, the operation method of the electronic tag further includes: after the initialization of the electronic tag is performed, within a predetermined time: in response to the transceiver not establishing connection with the communication host, controlling, by the main controller, the electronic tag body to enter a sleep state; and in response to the transceiver establishing connection with the communication host and the transceiver receiving the display information sent by the communication host, storing, by the main controller, the display information in the flash memory, displaying, by the main controller, the display information through the display screen; and controlling, by the main controller, the transceiver to disconnect from the communication host, so that the electronic tag body enters a sleep state.

In some embodiments of the present disclosure, the operation method of the electronic tag further includes that: after the electronic tag body is in the sleep state, the main controller periodically wakes up the electronic tag body through the clock circuit, so that the electronic tag body is in a normal working state. In a case where the electronic tag body is periodically woken up, in response to an ambient temperature detected by the sensor being beyond an operating temperature range of the display screen, and the transceiver receiving the display information sent by the communication host, the main controller obtains the stored latest display information from the flash memory after the ambient temperature is within the operating temperature range of the display screen and the electronic tag body is woken up, so as to display the stored latest display information on the display screen.

In some embodiments of the present disclosure, the operation method of the electronic tag further includes: in response to the activation button being pressed, by the main controller, waking up the electronic tag body from the sleep state; after the electronic tag body is woken up from the sleep state through the activation button, within the predetermined time: in response to the transceiver not establishing connection with the communication host, entering, by the electronic tag body, a sleep state; and in response to the transceiver establishing connection with the communication host and the transceiver receiving the display information sent by the communication host, storing, by the main controller, the display information in the flash memory, displaying, by the main controller, the display information through the display screen; and controlling, by the main controller, the transceiver to disconnect from the communication host, so that the electronic tag body enters a sleep state.

In some embodiments of the present disclosure, the operation method of the electronic tag further includes: in response to a battery level being lower than a threshold value, performing, by the indicator light, a battery level warning prompt; and/or, in response to an ambient temperature being beyond a storage temperature range, performing, by the indicator light, a temperature warning prompt; and/or, in response to the electronic tag body being in a sleep state, performing, by the indicator light, a sleep state prompt.

In some embodiments of the present disclosure, information displayed on the display screen includes at least one of vehicle annual inspection information, environmental protection information, and vehicle insurance information.

BRIEF DESCRIPTION OF THE DRAWINGS

In order to describe technical solutions in embodiments of the present disclosure more clearly, accompanying drawings to be used in the description of embodiments will be introduced below briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in embodiments of the present disclosure will be described clearly and completely with reference to the accompanying drawings in the embodiments of the present disclosure. Obviously, the described embodiments are merely some but not all of embodiments of the present disclosure. All other embodiments obtained based on the embodiments of the present disclosure by a person of ordinary skill in the art without paying any creative effort shall be included in the protection scope of the present disclosure.

Figure 1:
FIG. 1 is a schematic front view of an electronic tag body, according to some embodiments of the present disclosure.
Figure 2:
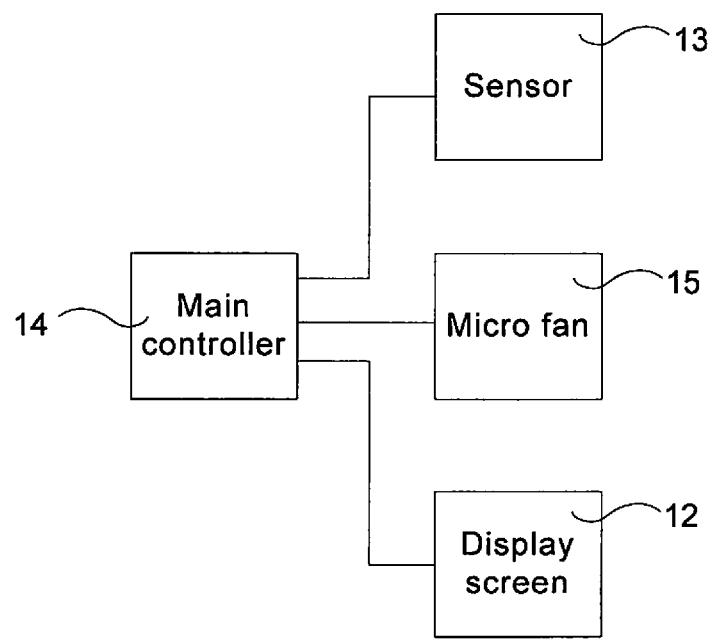
FIG. 2 is a schematic diagram showing a connection structure of components in an electronic tag, according to some embodiments of the present disclosure.

Some embodiments of the present disclosure provide an electronic tag, which includes an electronic tag body and a power supply configured to supply power to the electronic tag body. As shown in FIGS. 1 and 2, the electronic tag body 10 includes a housing 11, a sensor 13 and a main controller 14 that are disposed in the housing 11, and a display screen 12 configured to display information.

Positions of the sensor 13 and the main controller 14 shown in FIG. 1 are only for illustration, and the sensor 13 and the main controller 14 may have more suitable positions in an actual product. It can be understood that in the actual product, components located in the housing 11, such as the sensor 13, the main controller 14, the power supply 40, and a micro fan 15 and a switch circuit that will be mentioned later, are all covered by the housing 11 and are invisible. It is shown as visible in FIG. 1 only for illustration and understanding.

The sensor 13 is configured to detect an ambient temperature of an environment in which the electronic tag body 10 is located.

The main controller 14 is configured to stop supplying power to the display screen 12 in a case where the ambient temperature detected by the sensor 13 is beyond an operating temperature range of the display screen 12.

Figure 3:
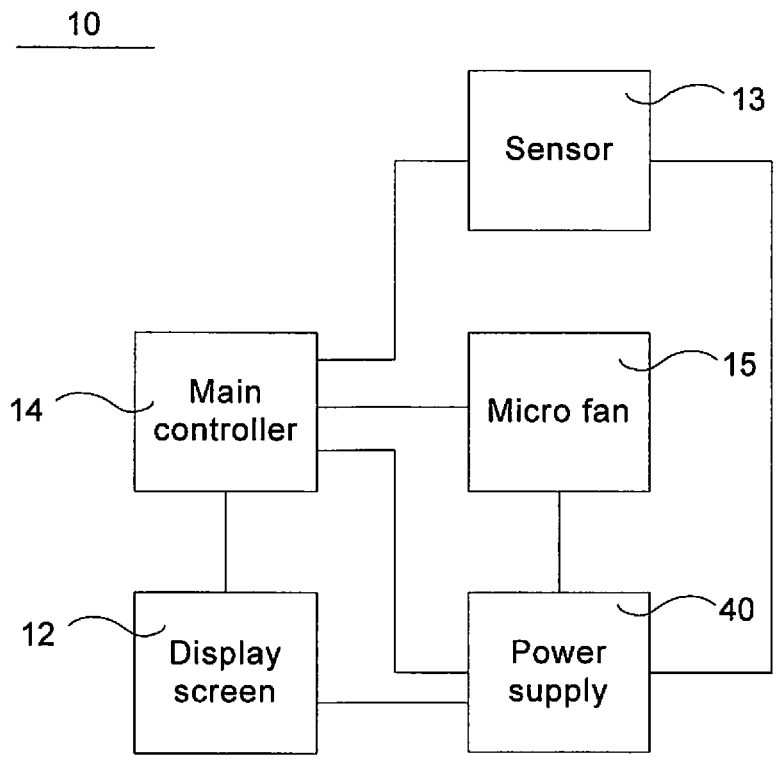
FIG. 3 is a schematic diagram showing another connection structure of components in an electronic tag, according to some embodiments of the present disclosure.

As shown in FIGS. 1 and 3, the power supply 40 included in the electronic tag is configured to supply power to the electronic tag body 10, i.e., supply power to the main controller 14, the sensor 13, the micro fan 15 (described later) and the display screen 12, etc.

The Housing

The housing 11 is a structure having a cavity therein, so that the sensor 13, the main controller 14, the micro fan 15 and the like may be disposed in the housing 11.

The sensor 13, the main controller 14 and the switch circuit may be disposed on a circuit board. The micro fan 15 may be directly disposed on the circuit board or fixed at a suitable position in the housing 11, so that the display screen 12 and even the electronic tag body 10 may be effectively cooled when the micro fan 15 is turned on.

The housing 11 may be formed through a lightweight integrated injection molding process, so as to make the electronic tag body 10 have a light weight.

The Display Screen

The display screen 12 is connected to the main controller 14, and is controlled by the main controller 14 to display information.

An arrangement manner of the display screen 12 may be that, for example, an opening is provided in a front portion of the housing 11, and the display screen 12 is located in the housing 11. A display area of the display screen 12 corresponds to the opening in the front portion of the housing 11 (referring to FIG. 1).

The operating temperature of the display screen 12 ranges from C1 to C2, in which C1 is less than C2. Based on this, the ambient temperature (denoted as D) may be beyond the operating temperature range of the display screen 12. That is, D is greater than C2, or D is less than C1.

It will be understood that the power supplied to the display screen 12 will be shut off when the ambient temperature is beyond the operating temperature range of the display screen 12. However, in order to ensure the normal use of the electronic tag, the power will be supplied to the display screen 12 again when the ambient temperature is within the operating temperature range of the display screen 12.

That the power supplied to the display screen 12 is shut off means that, the power supply is disconnected from the display screen 12. That the power is supplied to the display screen 12 again means that, the power supply is connected to the display screen 12.

An electronic paper display screen consumes current only when being refreshed, and the electronic paper display screen is in a low power consumption state at other times. Therefore, in some embodiments of the present disclosure, the electronic paper display screen may be used as the display screen 12. For example, a 4.2-inch electronic paper display screen is selected as the display screen 12 in some embodiments of the present disclosure.

An operating temperature of the electronic paper display screen ranges from 0° C. to 50° C. A person skilled in the art understands that in an example where the operating temperature of the electronic paper display screen ranges from 0° C. to 50° C., the operating temperature range includes 0° C. and 50° C., and other numerical ranges are similar.

The Sensor

For the sensor 13, an operating temperature range thereof should include the operating temperature range of the display screen 12. That is, the sensor 13 may work within the operating temperature range of the display screen 12. The operating temperature of the sensor 13 ranges from B1 to B2, in which B1 is less than B2. As described above, the operating temperature of the display screen 12 ranges from C1 to C2. B1 is less than C1, and B2 is greater than C2.

The sensor 13 may be a temperature and humidity sensor. That is, the temperature and humidity sensor may detect both temperature and humidity.

An operating temperature of the temperature and humidity sensor may range from minus 40° C. to 125° C., a precision error is within 0.3° C., and a relative humidity accuracy error is within 2% RH, which may meet the use requirements of vehicle-mounted environment.

The Power Supply

The power supply 40 may be a battery disposed in the housing 11 of the electronic tag, or an external power supply connected to internal components of the electronic tag through a power line, or a combination of the battery and the external power supply. Due to the mobility of the electronic tag, the power supply 40 is provided in the form of the battery in most cases. The battery may be a disposable battery or a rechargeable battery. The external power supply may be a solar power supply or a vehicle-mounted power supply.

Hereinafter, descriptions will be made with a case where the power supply 40 includes the solar power supply and the rechargeable battery.

Figure 6:
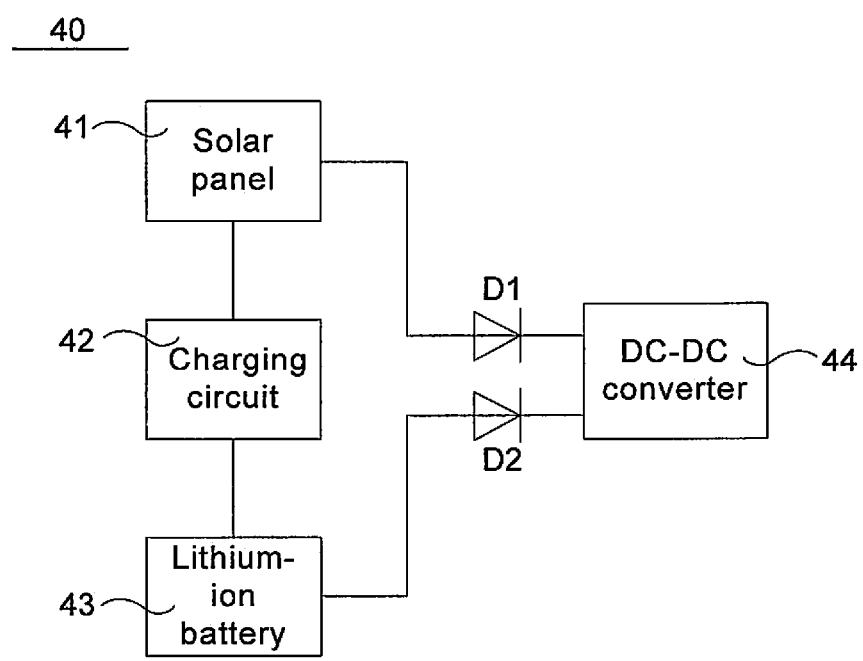
FIG. 6 is a schematic diagram showing a connection of components of a power supply in an electronic tag, according to some embodiments of the present disclosure.

In some embodiments of the present disclosure, as shown in FIG. 6, the power supply 40 includes a solar panel 41, a charging circuit 42, a lithium-ion battery 43, and a DC-DC (direct current to direct current) converter 44. The solar panel 41 is connected to the lithium-ion battery 43 through the charging circuit 42. The solar panel 41 and the lithium-ion battery 43 are also connected to input terminals of the DC-DC converter 44 through diodes, respectively.

The solar panel 41 may be disposed outside the housing 11 to receive sunlight. The charging circuit 42, the lithium-ion battery 43 and the DC-DC converter 44 may be disposed in the housing 11 of the electronic tag body 10. That is, the charging circuit 42, the lithium-ion battery 43 and the DC-DC converter 44 may be disposed on the circuit board.

The solar panel 41 and the lithium-ion battery 43 are each connected to an input terminal of the DC-DC converter 44 through a diode. That is, as shown in FIG. 6, the solar panel 41 is connected to an input terminal of the DC-DC converter 44 through a first diode D1, and the lithium-ion battery 43 is connected to another input terminal of the DC-DC converter 44 through a second diode D2. Based on this, it will be understood that an output terminal of the DC-DC converter 44 is configured to supply power to components of the electronic tag.

A power supply manner of the power supply 40 is as follows. In a case where an output voltage of the solar panel 41 is higher than that of the lithium-ion battery 43, the first diode D1 is turned on and the second diode D2 is turned off. The solar panel 41 supplies power to the input terminal of the DC-DC converter 44, and the solar panel 41 charges the lithium-ion battery 43 through the charging circuit 42 at the same time. In a case where an output voltage of the solar panel 41 is lower than that of the lithium-ion battery 43, the second diode D2 is turned on and the first diode D1 is turned off. The lithium-ion battery 43 supplies power to the another input terminal of the DC-DC converter 44, and the charging circuit 42 stops working. In a case where an output voltage of the solar panel 41 is equal to that of the lithium-ion battery 43, the solar panel 41 and the lithium-ion battery 43 may supply power to the input terminals of the DC-DC converter 44 together. In this case, voltages at the solar panel 41, the lithium-ion battery 43 and the input terminals of the DC-DC converter 44 are equal.

For example, the lithium-ion battery 43 may be a 3.7 V lithium-ion battery. The solar panel 41 may be a polycrystalline solar panel, which has a small size, a 5 V output voltage, and a peak current up to 120 mA, and which can charge the 3.7 V lithium-ion battery. A chip that supports constant current/constant voltage linear charging (such as TP4056) may be used as the charging circuit 42, and this chip has an adjustable charging current and an overheating protection function. In the case where the TP4056 chip is used as the charging circuit 42, the charging circuit 42 may charge the lithium-ion battery 43 when the output voltage of the solar panel 41 is higher than the voltage of the lithium-ion battery 43 by more than 30 mV. A low dropout regulator (LDO) (such as LT1962) having a low power consumption and a low noise may be used as the DC-DC converter 44.

In some embodiments of the present disclosure, since the power supply 40 consists of components such as the solar panel 41, the charging circuit 42, the lithium-ion battery 43, and the DC-DC converter 44 is used, an external power supply is not needed, which may realize energy saving, environmental protection, an aesthetic appearance, and convenience of use. Based on this, in a case where the solar panel 41 is the polycrystalline solar panel, the solar panel 41 has the characteristics of low cost, low power consumption, long service life, and the like. The solar panel 41 is disposed outside the housing 11, and thus does not occupy the volume of the electronic tag body 10, so that the electronic tag body 10 has a small volume.

The Main Controller

The main controller is the control center of the electronic tag. The main controller is connected to each part of the entire electronic tag through various interfaces and lines. The main controller runs or executes corresponding instructions, so that the electronic tag may accomplish corresponding operations. The operations may be, for example, receiving signals sent by an external communication host (such as a mobile phone, or a computer), analyzing and processing the received signals, and then displaying information on the display screen.

The main controller 14 may be realized by a chip, an integrated circuit, or the like. A modem processor may be integrated in the main controller 14, and the modem processor mainly processes wireless communication, such as Bluetooth or Wi-Fi. It will be understood that the modem processor may also not be integrated in the main controller.

In some embodiments of the present disclosure, a Bluetooth low energy (BLE) system-on-a-chip (SoC) (such as a chip CC2541, CC2543, or CC2564 produced by Texas Instruments (TI)) may be used as the main controller 14. The BLE SoC has an internal central processing unit (CPU) which is a 16-bit enhanced 8051 single-chip microcomputer, includes an integrated 2.4 G radio frequency signal processing unit, and uses an operating system abstraction layer (OSAL) and BLE 4.0 protocol stack, thereby accomplishing various tasks of application layers and Bluetooth wireless communication simultaneously.

The display screen 12 may be connected to the main controller 14 through a serial peripheral interface (SPI). The sensor 13 is connected to the main controller 14 through an inter-integrated circuit (I2C) bus.

In a case where the electronic tag is used in an outdoor environment and the electronic tag is exposed to the sunlight directly, the ambient temperature may exceed the temperature range (e.g., the operating temperature range of the display screen) that the display screen of the electronic tag can bear. However, the electronic tag can detect the ambient temperature through the sensor 13, and may determine whether the ambient temperature exceeds the operating temperature range of the display screen 12. Once the ambient temperature is beyond the operating temperature range, the supply of the power to the display screen 12 is stopped, so that the electronic tag may be effectively protected in an outdoor environment with a high temperature.

In addition, the electronic tag also has more additional advantages, which will be described below with reference to some variants of the electronic tag.

Variant One

The electronic tag further includes a micro fan 15 disposed in the housing 11. The micro fan 15 may be a low power consumption ultra-thin micro fan with a power supply of DC 3.3 V (the DC-DC converter 44 may convert 3.7 V to 3.3 V) and a power of 0.2 W. The dimension of the micro fan ranges from 9 mm to 20 mm, and a shape of the micro fan is a square, a circular, or the like.

In a case where the ambient temperature detected by the sensor 13 is higher than a maximum value of a storage temperature range of the display screen 12, the micro fan 15 is turned on to cool down the display screen 12 until the ambient temperature drops to a preset temperature lower than or equal to the maximum value of the storage temperature range, and then the micro fan 15 is turned off.

It will be understood that the display screen 12 is not limited to be cooled down using the micro fan 15, and similar heat dissipation devices may also be used. The heat dissipation device may be, for example, a cooling fin using coolant or a micro-channel heat sink.

The storage temperature range of the display screen 12 is from A1 to A2, in which A1 is less than A2. For example, in a case where the display screen 12 is implemented by the electronic paper display screen, the storage temperature range thereof is from minus 20° C. to 70° C.

Generally speaking, the storage temperature range of the display screen 12 should include the operating temperature range of the display screen 12. As described above, the operating temperature of the display screen 12 ranges from C1 to C2. That is, A1 is less than C1, and A2 is greater than C2.

In addition, for the sensor 13, the operating temperature range thereof should include the storage temperature range of the display screen 12. That is, the sensor 13 may work within the storage temperature range of the display screen 12. As described above, when the operating temperature of the sensor 13 ranges from B1 to B2, B1 is less than A1, and B2 is greater than A2.

It can be seen that a relationship among the operating temperature range C1 to C2 of the display screen 12, the storage temperature range A1 to A2 of the display screen 12, and the operating temperature range B1 to B2 of the sensor 13 is that: B1 is less than A1, and A1 is less than C1; and B2 is greater than A2, and A2 is greater than C2. For example, the operating temperature range of the display screen 12 is 0° C. to 50° C., the storage temperature range of the display screen 12 is minus 20° C. to 70° C., and the operating temperature range of the sensor 13 may be minus 40° C. to 125° C.

The ambient temperature (denoted as D) may be higher than the maximum value of the storage temperature range. That is, D is greater than A2.

If D is greater than A2, the micro fan 15 is turned on until D drops to a certain preset temperature which is less than A2, and then the micro fan 15 is turned off. The preset temperature may be set according to actual conditions, which is not limited herein.

In a case where the electronic tag is used in an outdoor environment, if the electronic tag is directly exposed to the sunlight, the ambient temperature may exceed not only the operating temperature range of the display screen of the electronic tag but also the storage temperature range of the display screen. Therefore, the high temperature of the outdoor environment may damage the electronic tag even though the electronic tag is turned off, i.e., not in use. Therefore, in some embodiments of the present disclosure, when the ambient temperature is higher than the maximum value of the storage temperature range, the micro fan 15 is turned on to cool down the display screen 12. In a process of cooling down the display screen 12, the electronic tag will also be cooled down, so that the electronic tag may be effectively protected in the outdoor environment with a high temperature.

Variant Two

The electronic tag further includes a switch circuit disposed in the housing 11. The main controller 14 controls whether to supply power or not to the display screen 12 or the micro fan 15 through the switch circuit.

In some embodiments of the present disclosure, the main controller 14 controls the power supply 40 to supply or not to supply power to the display screen 12. For example, the main controller 14 controls whether the power supply 40 supplies power to the display screen 12 through a metal-oxide-semiconductor field-effect transistor (MOSFET) switch circuit.

Figure 7:
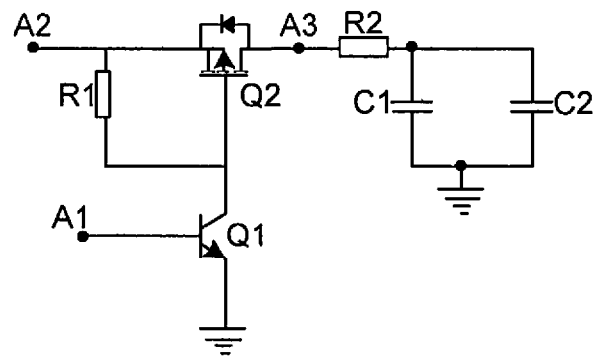
FIG. 7 is a schematic diagram of a MOSFET switch circuit in an electronic tag, according to some embodiments of the present disclosure.

For example, the MOSFET switch circuit may be a circuit as shown in FIG. 7. When the main controller 40 outputs a high level to a first node A1, a transistor Q1 is turned on, and in this case, an MOSFET Q2 is turned on. The supply voltage output by the power supply 40 to a second node A2 is transmitted to a third node A3, and then is provided to the display screen 12. When the main controller 40 outputs a low level to the first node A1 the transistor Q1 and the MOSFET Q2 are turned off. The supply voltage output by the power supply 40 to the second node A2 cannot be transmitted to the third node A3, and the power supplied to the display screen 12 by the power supply 40 is shut off.

The MOSFET switch circuit may be disposed on the circuit board.

Since the main controller 14 controls whether to supply power to the display screen 12, and the main controller 14 can respond quickly when it is needed to stop supplying power to the display screen 12, the display screen 12 may be protected to the greatest extent. Based on this, in a case where the electronic paper display screen is used, the power supply of the electronic paper display screen may be shut down under the control of the main controller 14 when the electronic paper display screen is in a sleep state, thereby reducing power consumption. It will be understood that when the electronic paper display is in the sleep state, the electronic paper display screen will consume a certain amount of current (dozens of microamperes) as long as the power is supplied to it.

In some embodiments of the present disclosure, the main controller 14 further controls whether the power supply 40 supplies power to the micro fan 15. For example, the main controller 40 controls whether the power supply 40 supplies power to the micro fan 15 by controlling a MOSFET switch circuit. The MOSFET switch circuit may be the same as the MOSFET switch circuit described above.

Since the main controller 14 controls whether to supply power to the micro fan 15, and the main controller 14 can respond quickly when it is required to stop supplying power to the micro fan 15, the micro fan 15 may be protected to the greatest extent and the power consumption may be reduced.

Variant Three

Figure 8:
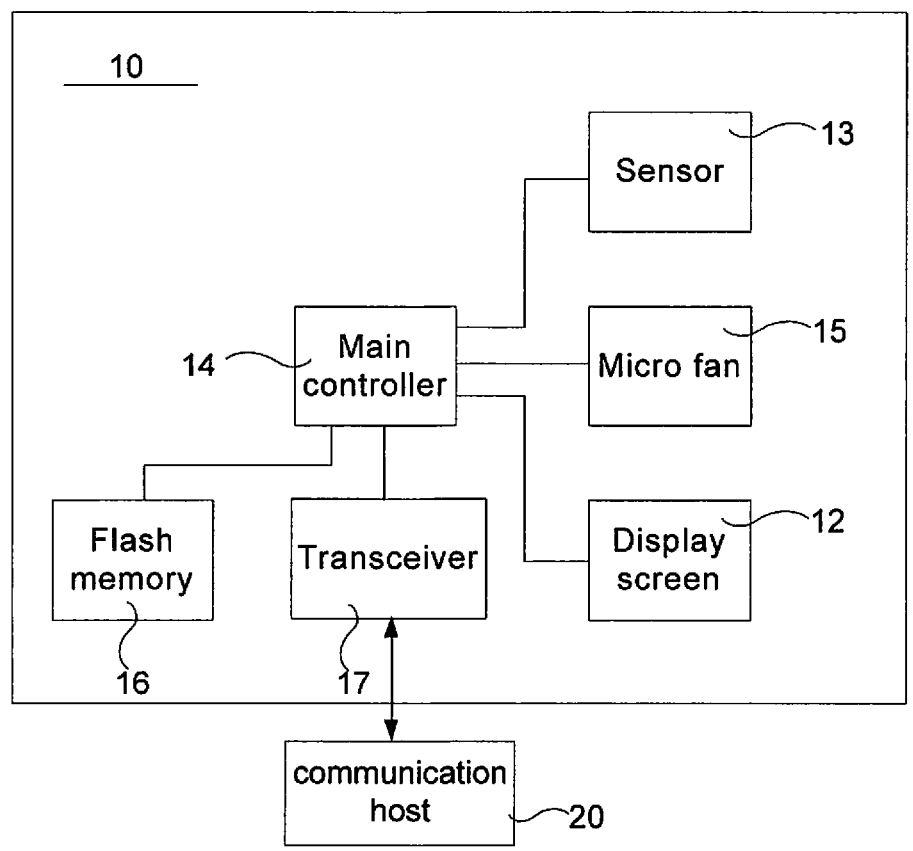
FIG. 8 is a schematic diagram showing yet another connection structure of components in an electronic tag, according to some embodiments of the present disclosure.

As shown in FIG. 8, the electronic tag body 10 further includes a flash memory 16 and a transceiver 17 that are disposed in the housing 11. The transceiver 17 is configured to communicate with the communication host to obtain the display information sent by the communication host. The flash memory 16 is at least configured to store the latest display information sent by the communication host. The display screen 12 is configured to display the display information obtained from the flash memory 16 under the control of the main controller 14.

Both the flash memory 16 and the transceiver 17 are connected to the main controller 14. In a case where the transceiver 17 communicates with a communication host (such as a mobile phone or a computer), after the transceiver 17 receives the display information sent by the communication host, under the control of the main controller 14, the display information is stored in the flash memory 16 and displayed on the display screen 12. The flash memory 16 and the transceiver 17 may be disposed on the circuit board.

It will be noted that in a case where the latest display information sent by the communication host is stored in the flash memory 16, if the flash memory 16 is only configured to store the latest display information sent by the communication host, the previously stored display information will be deleted, and only the latest display information currently sent by the communication host is stored.

The flash memory is a kind of non-volatile memory (that is, the stored data information may still be reserved in a case of power failure). The embodiments of the present disclosure are not limited to use the flash memory, and the flash memory may also be replaced by other non-volatile memories, such as an electronically erasable programmable read-only memory (EEPROM). In addition to the display information sent by the communication host, the flash memory 16 may further store working parameters, font data, or the like of the electronic tag body 10.

In a case where the BLE SoC is used as the main controller 14, and the display screen 12 is connected to the main controller 14 through SPI, the flash memory 16 may be connected to the main controller 14 through a multiplexed SPI.

The transceiver 17 may be a wireless transceiver or a wired transceiver. The wireless transceiver may be a Bluetooth transceiver, a Wi-Fi transceiver, or the like. The Bluetooth transceiver has the advantage of low power consumption. Based on this, the Bluetooth transceiver may be integrated in the main controller 14. The integration of the Bluetooth transceiver in the main controller 14 makes the main controller 14 realize the control function and wireless communication function simultaneously, which may effectively reduce the cost and the area of the circuit board. The communication host may be a Bluetooth host having a Bluetooth device, such as a mobile phone or a computer.

In some embodiments of the present disclosure, the transceiver 17 communicates with the communication host, and the flash memory 16 stores the display information sent by the communication host, which may make the information displayed on the display screen 12 be updated conveniently. The flash memory 16 at least stores the latest display information sent by the communication host, which may facilitate the recovery of the display information when the system reboots.

Variant Four

Figure 9:
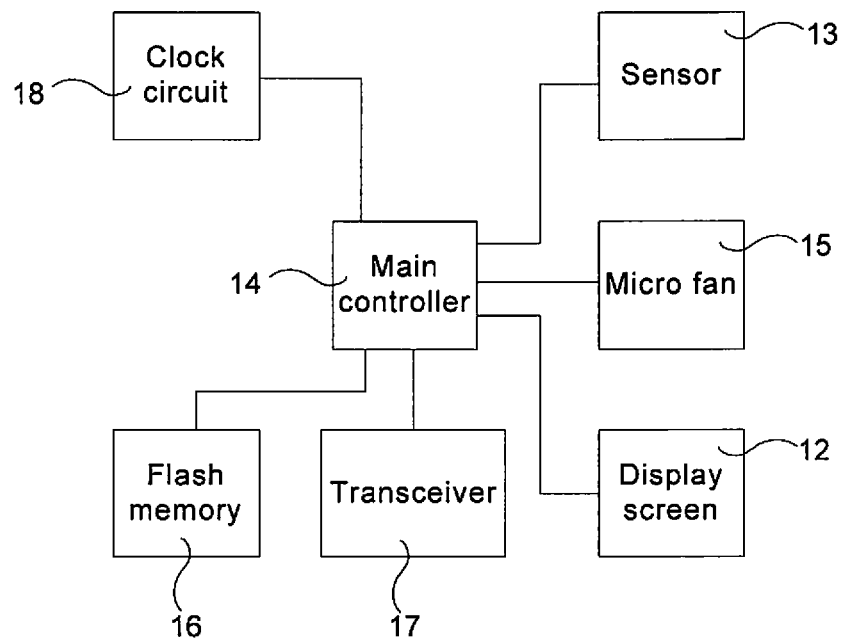
FIG. 9 is a schematic diagram showing yet another connection structure of components in an electronic tag, according to some embodiments of the present disclosure.

In a case where the display screen 12 is the electronic paper display screen, as shown in FIG. 9, the electronic tag body 10 may further include a clock circuit 18 disposed in the housing 11. The main controller 14 is further configured to control the electronic tag body 10 to enter the sleep state, and wake up the electronic tag body 10 periodically through the clock circuit 18 after the electronic tag body enters the sleep state, so that the electronic tag body 10 is in a normal working state.

The clock circuit 18 may be integrated in a clock chip. A pulse output terminal of the clock circuit 18 may be connected to the main controller 14 through an input/output (I/O) interface. The clock circuit 18 may be disposed on the circuit board.

It may be understood that all components and circuits of the electronic tag body 10 work normally when the electronic tag body 10 is in a normal working state. The electronic tag body 10 being in a sleep state means that all components and circuits in the electronic tag body 10 are in a low power consumption state.

In addition, the electronic paper display screen consumes current only when being refreshed, and is in a low power consumption state at other times. Therefore, even though the electronic tag body 10 has entered the sleep state under the control of the main controller 14, the display of the electronic paper display screen will still be normal.

In some embodiments of the present disclosure, by making the electronic tag body 10 stay in the sleep state and making the clock circuit 18 periodically wake up the electronic tag body 10, normal detection and information update may be realized with the power consumption reduction.

Variant Five

In some embodiments of the present disclosure, the electronic tag may further include an activation button. The main controller 14 is further configured to wake up the electronic tag body 10 from the sleep state after the activation button is pressed.

The activation button may be connected to the I/O interface of the main controller 14 through RC low-pass filter.

Figure 10:
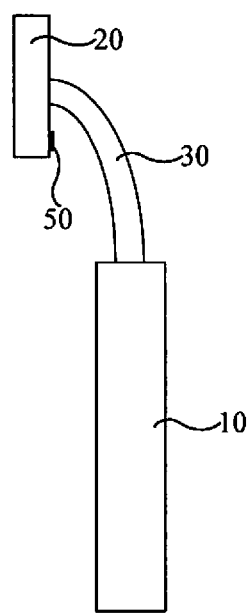
FIG. 10 is a schematic side view of another electronic tag, according to some embodiments of the present disclosure.

The position of the activation button is not limited, as long as the position is convenient for users to press. For example, as shown in FIG. 10, the activation button 50 may be disposed on a mounting base 20. Of course, the activation button 50 may also be disposed on the housing 11 of the electronic tag body 10.

In some embodiments of the present disclosure, by arranging the activation button 50, the electronic tag body 10 may be woken up from the sleep state at any time according to users' needs, thereby improving user experience.

Variant Six

In some embodiments of the present disclosure, the electronic tag further includes at least one indicator light. The at least one indicator light is connected to the main controller 14 and is configured to perform at least one operation of temperature alarm, power alarm and deep sleep state prompt under the control of the main controller 14.

Figure 11:
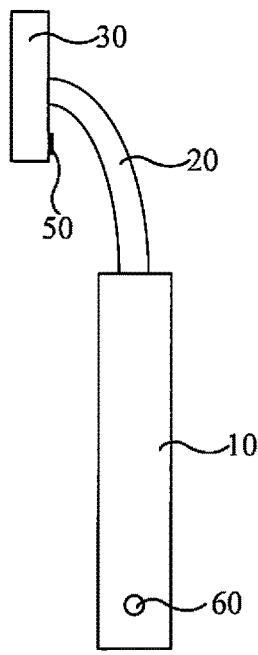
FIG. 11 is a schematic side view of yet another electronic tag, according to some embodiments of the present disclosure.

As shown in FIG. 11, the at least one indicator light 60 may be disposed on a side face of the housing 11. The housing 11 has an opening at a position corresponding to the indicator light 60. In this way, a connection between the indicator light 60 and the main controller 14 may be easier.

The indicator light 60 may be configured to indicate one state, or two or more states. In a case where the indicator light indicates two or more states, for example, performs both the temperature alarm and the power alarm, it may indicate different states through different flashing frequencies.

In addition, the indicator light is not limited to only performing the temperature alarm, the power alarm, and the deep sleep state prompt, but may also perform other types of alarms, prompts, or the like, which all belong to the protection scope of the present disclosure.

In some embodiments of the present disclosure, by setting the indicator light 60, the indicator light 60 may perform specific prompts, so that the users may more intuitively understand some prompts presented by the electronic tag.

Variant Seven

Figure 4:
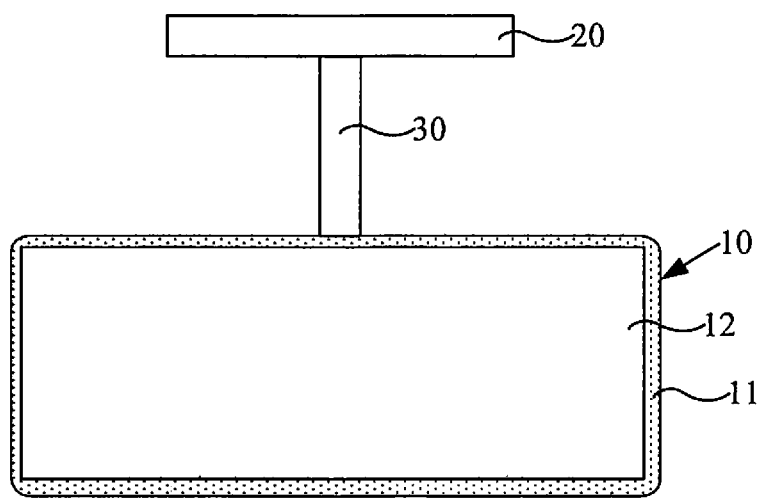
FIG. 4 is a schematic front view of another electronic tag, according to some embodiments of the present disclosure.
Figure 5:
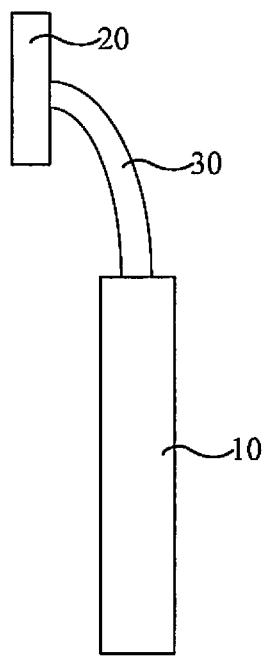
FIG. 5 is a schematic side view of another electronic tag, according to some embodiments of the present disclosure.

In some embodiments of the present disclosure, as shown in FIGS. 4 and 5, the electronic tag further includes a mounting base 20 and a bendable connecting rod 30. One end of the bendable connecting rod 30 is fixedly connected to the mounting base 20, and another end is fixedly connected to the electronic tag body 10.

Based on this structure, any of the above electronic tags may be applied to automobiles to serve as a vehicle-mounted electronic tag. The display screen 12 displays information about the status of a vehicle such as vehicle annual inspection information, environmental protection information, and vehicle insurance information. Compared with displaying the information such as the vehicle annual inspection information, the environmental protection information, and the vehicle insurance information with the traditional sticking paper tags, the use of electronic tag may avoid problems that an attractive appearance of a car window is affected due to the fact that the paper tag is not easy to clean when being replaced, which may be more beneficial to environmental protection.

In a case where the electronic tag according to some embodiments of the present disclosure is applied to an automobile, the mounting base 20 may be fixed to the automobile, and the display screen 12 may face a front windshield of the automobile. The electronic tag body 10 may be parallel to and kept a certain distance from the front windshield of the automobile by adjusting the bendable connecting rod 30. The distance between the electronic tag body 10 and the front windshield of the automobile may avoid physical damage that may be caused to the electronic tag body 10 by high temperature under a certain condition when the electronic tag body 10 is in direct contact with the front windshield of the automobile, which may decrease the temperature of the electronic tag body 10 as much as possible.

A manner of fixing the mounting base 20 to the automobile is not limited. For example, the mounting base 20 may be fixed to the automobile through super transparent double-sided tape.

In a case where the power supply of the electronic tag includes the solar panel 41, the solar panel 41 may be disposed on the mounting base 20. A position of the solar panel 41 on the mounting base 20 should be determined such that the solar panel can receive light. That is, in a case where the mounting base 20 is fixed on the front windshield of the automobile, the solar panel 41 should be provided at a position adjacent to the front windshield of the automobile. Based on this, in order to provide sufficient electrical energy, a light receiving area of the solar panel 41 may be increased as much as possible.

In addition, wires that electrically connect the solar panel 41 to the charging circuit 42 and the DC-DC converter 44 may also be disposed in the bendable connecting rod 30.

It may be seen from the above introduction that some embodiments of the present disclosure provide an electronic tag and many different variants of it. It will be understood that the various variants of the electronic tag may be combined arbitrarily, rather than being independent from each other. For example, besides basic structures, the electronic tag may further have multiples components such as the micro fan 15, the switch circuit, the flash memory 16, the transceiver 17, the clock circuit 18, the activation button, the indicator light, the mounting base 20, and the bendable connecting rod 30, so as to have more and more complete functions. Of course, besides the basic structures, the electronic tag may further include only one or several other components, instead of all the above components. For example, the electronic tag may only further include the micro fan 15, or only further include the micro fan 15, the switch circuit, the flash memory 16 and the transceiver 17.

Figure 13:
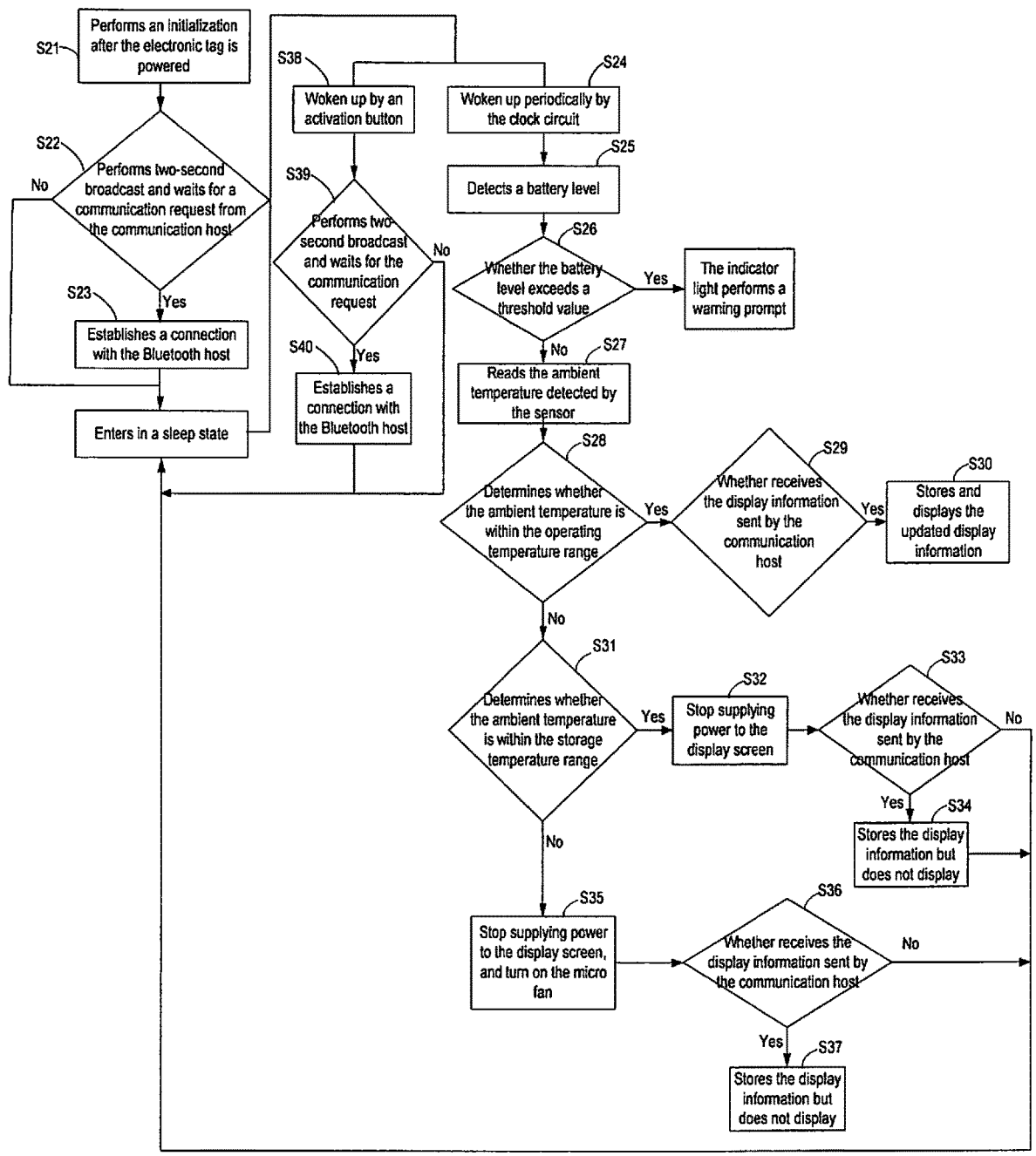
FIG. 13 is a schematic flowchart of another operation method of an electronic tag, according to some embodiments of the present disclosure.

Some embodiments of the present disclosure further provide an operation method of the electronic tag. As shown in FIG. 13, the operation method of the electronic tag includes the following steps (S21 to S40).

In S21, an electronic tag is initialized after being powered.

In some embodiments of the present disclosure, the electronic tag needs to go through a series of initializations after being powered. In an example where the electronic tag includes the electronic paper display screen, the main controller 14, the sensor 13, the flash memory 16, and the clock circuit 18, and Bluetooth transceiver is integrated in the main controller 14, after the electronic tag is powered, internal components (including interfaces) of the main controller 14 and the BLE protocol stack (including transmit power, broadcast interval) are first initialized, and then external hardware including the sensor 13, the clock circuit 18, the flash memory 16, and the electronic paper display screen are initialized.

In some embodiments of the present disclosure, in a case where the display screen 12 is the electronic paper display screen, an initialization of the electronic paper display screen includes: detecting, by the main controller 14, whether there is display information stored in the flash memory 16; if not, controlling, by the main controller 14, the power supply 40 to stop supplying power to the display screen; otherwise, obtaining, by the main controller 14, the display information from the flash memory 16 and writing, by the main controller 14, the information into the video memory of the display screen 12 for display; and controlling, by the main controller 14, the power supply 40 to stop supplying power to the display screen 12 after the normal display of the display screen is achieved.

That the main controller 14 obtains the display information from the flash memory 16 and writes the information into the video memory of the display screen 12 for display may be achieved by using a method of reading the display information from the flash memory 16 in segments and writing display information to the video memory in segments.

It may be seen from the initialization process of the electronic paper display that no matter whether the main controller 14 has obtained the display information from the flash memory 16, the electronic paper display screen is eventually disconnected from the power supply 40, which may greatly reduce power consumption.

In S22, after the electronic tag is initialized, the main controller 14 waits for a communication request from the communication host within a predetermined time; if there is a request, S23 is performed, and otherwise, the main controller 14 stops performing broadcast and enters a sleep state.

In some embodiments of the present disclosure, after the electronic tag is powered and initialized, the operation method of the electronic tag further includes the following steps. Within the predetermined time, in response to the transceiver 17 not establishing a connection with the communication host, the main controller 14 controls the electronic tag body 10 to enter the sleep state. Within the predetermined time, in response to the transceiver 17 establishing a connection with the communication host, and the transceiver 17 receiving the display information sent by the communication host, the main controller 14 stores the display information in the flash memory 16, the display screen 12 displays the information, and then the main controller 14 controls the transceiver 17 to disconnect from the communication host, so that the electronic tag body 10 enters the sleep state.

In some embodiments of the present disclosure, in a case where a Bluetooth transceiver is integrated in the main controller 14, the main controller 14 may perform broadcast, for example, two-second broadcast, and wait for a communication request from the communication host (a Bluetooth host in this case) after the electronic tag is initialized. If there is no Bluetooth host connected to the electronic tag, the main controller 14 stops performing broadcast and enters a sleep state; if there is a Bluetooth host connected to the electronic tag, the electronic tag exchanges information with the communication host according to a predetermined communication protocol, or exchanges information with the server through the Bluetooth host according to a predetermined communication protocol. And after the display information sent by the Bluetooth host or sent by the server through the Bluetooth host is obtained, the display information is stored in the flash memory 16 and displayed through the display screen 12, and then the transceiver 17 is controlled to be disconnected from the Bluetooth host, so that the electronic tag body enters the sleep state.

In S23, the electronic tag establishes a connection with the communication host according to a predetermined communication protocol, so that the electronic tag performs information interaction with the communication host or a server that is communicatively connected to the communication host; and after obtaining the display information sent by the communication host or the server, the main controller 14 stores the display information in the flash memory 16, displays the display information through the display screen 12, and then controls the transceiver 17 to disconnect from the communication host, so that the electronic tag body enters the sleep state.

In some embodiments of the present disclosure, the electronic tag receives the display information sent by the communication host or the server through the transceiver 17, and the main controller 14 makes the flash memory 16 store at least the latest display information sent by the communication host. Therefore, the display information displayed on the display screen 12 is the stored latest display information obtained from the flash memory 16.

The transceiver 17 communicates with the communication host, and the flash memory 16 stores the display information sent by the communication host, so that the information displayed on the display screen 12 may be updated conveniently. The flash memory 16 at least stores the latest display information sent by the communication host, which may facilitate the recovery of the display information when the system reboots.

In some embodiments of the present disclosure, that the electronic tag performs information interaction with the server includes the following steps. The server sends a specific authentication number of the server to the electronic tag through the communication host; if the electronic tag determines that the server is a legally authenticated server, the electronic tag sends some information of its own (the vehicle-mounted electronic tag is taken as an example, and the information may be a license plate number, a vehicle identification number, an engine number, etc.); after the server queries the database through a network, if the vehicle information is normal, the server will send display information such as the vehicle annual inspection information, the environmental protection information, and the vehicle insurance information to the electronic tag; otherwise, the server may issue a warning prompt.

In some embodiments of the present disclosure, the operation method of the electronic tag further includes prompting the sleep state through the indicator light when the electronic tag body 10 is in the sleep state. By arranging the indicator light 60, and making the indicator light 60 perform specific prompts, the users may more intuitively understand some prompts presented by the electronic tag.

In S24, after the electronic tag body 10 is in the sleep state, the main controller 14 periodically wakes up the electronic tag body 10 through the clock circuit 18.

By making the electronic tag body 10 enter the sleep state and be periodically woken up through the clock circuit 18, normal detection and information update may be realized with the power consumption reduction.

In addition, the main controller 14 may also wake up the electronic tag body 10 from the sleep state in response to the activation button 50 being pressed.

In a case where the electronic tag body 10 is woken up from the sleep state through the activation button 50, the main controller 14 waits for, within the predetermined time, the transceiver 17 establishing a connection with the communication host. If the transceiver 17 receives the display information sent by the communication host, and the ambient temperature detected by the sensor 13 is within the operating temperature range of the display screen 12, the main controller 14 obtains the stored latest display information from the flash memory 16 for display through the display screen 12 (that is, the electronic tag body 10 is in a normal working state).

In S25, the main controller 14 detects battery level after the electronic tag is periodically woken up.

In S26, the main controller 14 determines whether the battery level is lower than a threshold value; if the battery level is lower than the threshold value, the indicator light 60 will perform a warning prompt about the battery level; otherwise, S27 will be performed.

By arranging the indicator light 60, and making the indicator light 60 perform specific prompts, the users may more intuitively understand some prompts presented by the electronic tag.

In S27, the main controller 14 reads the ambient temperature detected by the sensor 13.

In S28, the main controller 14 determines whether the ambient temperature is within the operating temperature range of the display screen 12, and if it is, S29 is performed; otherwise, S31 is performed.

In some embodiments of the present disclosure, the ambient temperature read by the main controller 14 has the following cases.

Case one: if the ambient temperature read by the main controller 14 is within the operating temperature range of the display screen 12, the main controller determines whether the transceiver 17 receives the display information sent by the Bluetooth host. If the transceiver 17 receives the display information, the display information is stored in the flash memory 16 and is displayed on the display screen 12.

Case 2: if the ambient temperature read by the main controller 14 is beyond the operating temperature range of the display screen 12 but within the storage temperature range, the power supplied to the display screen 12 is shut off. In this case, if the transceiver 17 receives the display information sent by the communication host, the display information is stored in the flash memory 16. After the electronic tag body 10 is periodically woken up by the clock circuit 18, if the ambient temperature is within the operating temperature range of the display screen 12, the display screen 12 is updated.

Case 3: if the ambient temperature read by the main controller 14 is beyond the storage temperature range, the micro fan 15 is turned on, and the micro fan 15 is used to cool down the display screen 12. After the ambient temperature drops to a preset temperature lower than or equal to the maximum value of the storage temperature range, the micro fan 15 is turned off. Similarly, in this case, if the transceiver 17 receives the display information sent by the Bluetooth host, the display information is stored in the flash memory 16. After the electronic tag body 10 is periodically woken up by the clock circuit 18, if the ambient temperature is within the operating temperature range of the display screen 12, the display screen 12 is updated.

In some embodiments of the present disclosure, the operation method of the electronic tag further includes: performing, by the indicator light 60, a temperature warning prompt when the main controller 14 determines that the ambient temperature is beyond the storage temperature range of the display screen 12. By arranging the indicator light 60, and making the indicator light 60 perform specific prompts, the users may more intuitively understand some prompts presented by the electronic tag.

In S29, the main controller 14 determines whether the transceiver 17 receives the display information sent by the communication host; if the transceiver 17 receives the display information, S30 is performed.

In some embodiments of the present disclosure, if the main controller 14 determines that the transceiver 17 establishes a connection with the communication host within the predetermined time, and the transceiver 17 receives the display information sent by the communication host, the display information will be stored in the flash memory 16 and displayed on the display screen 12. And then the main controller 14 controls the transceiver 17 to disconnect from the communication host, and the electronic tag will enter a sleep state. If the main controller 14 determines that the transceiver 17 does not establish a connection with the communication host within the predetermined time, the electronic tag will enter the sleep state again.

In a case where a Bluetooth transceiver is integrated in the main controller 14, the main controller 14 may perform broadcast, for example, two-second broadcast, and wait for a communication request from the Bluetooth host. If there is no Bluetooth host device connected to the electronic tag, the main controller 14 stops performing broadcast and enters a sleep state; if there is a Bluetooth host connected to the electronic tag, the electronic tag performs information interaction with the Bluetooth host or a server connected to the Bluetooth host according to the predetermined communication protocol. And after obtaining the display information sent by the Bluetooth host or the server through the Bluetooth host, the main controller 14 stores the display information in the flash memory 16 and displays the display information through the display screen 12. And then, the main controller 14 controls the transceiver 17 to disconnect from the communication host, so that the electronic tag body enters the sleep state.

In S30, the main controller 14 stores the display information in the flash memory 16 and controls the display screen 12 to display the display information.

In S31, the main controller 14 determines whether the ambient temperature is within the storage temperature range of the display screen 12, and if it is, S32 is performed; otherwise, S35 is performed.

In S32, the main controller 14 controls the power supply 40 to stop supplying power to the display screen 12.

In S33, the main controller 14 determines whether the transceiver 17 has received the display information sent by the communication host, and if so, S34 will be performed; otherwise, the electronic tag body 10 enters a sleep state.

In S34, the main controller 14 stores the display information in the flash memory 16, and after the electronic tag body 10 is periodically woken up by the clock circuit 18, if the ambient temperature is within the operating temperature range of the display screen 12, the display screen 12 is updated.

In S35, the main controller 14 controls the power supply 40 to stop supplying power to the display screen 12, and turns on the micro fan 15.

In S36, the main controller 14 determines whether the transceiver 17 has received the display information sent by the communication host, and if it is, S37 is performed; otherwise, the electronic tag body 10 enters a sleep state.

In S37, the main controller 14 stores the display information in the flash memory 16, and after the electronic tag body 10 is periodically woken up by the clock circuit 18, if the ambient temperature is within the operating temperature range of the display screen 12, the display screen 12 is updated.

In S38, after the electronic tag body 10 enters the sleep state, in response to the activation button 50 being pressed, the main controller 14 wakes up the electronic tag body 10 from the sleep state.

In S39, the main controller 14 waits for a communication request from the communication host within the predetermined time; if there is a communication request, S40 is performed; otherwise, the main controller 14 stops performing broadcast and the electronic tag body 10 enters a sleep state.

In S40, the electronic tag establishes connection with the communication host according to the predetermined communication protocol, so that the electronic tag performs information interaction with the communication host or exchanges information with a server that has a signal connection with the communication host; after obtaining the display information sent by the communication host or the server, the main controller 14 stores the display information in the flash memory 16 for display; the main controller 14 controls the transceiver 17 to disconnect from the communication host, so that the electronic tag body enters a sleep state.

As some variants of the operation method of the electronic tag shown in FIG. 13, the operation method of the electronic tag may not be performed completely in accordance with the steps and/or the order shown in FIG. 13. In some embodiments of the present disclosure, some operation steps may be omitted, or execution order of some steps may be changed. For example, the operation method of the electronic tag may only include S30, S32, and S35, and other steps may be added or deleted according to actual usage. For another example, the execution order of S25 and S27 may be interchanged.

Figure 12:
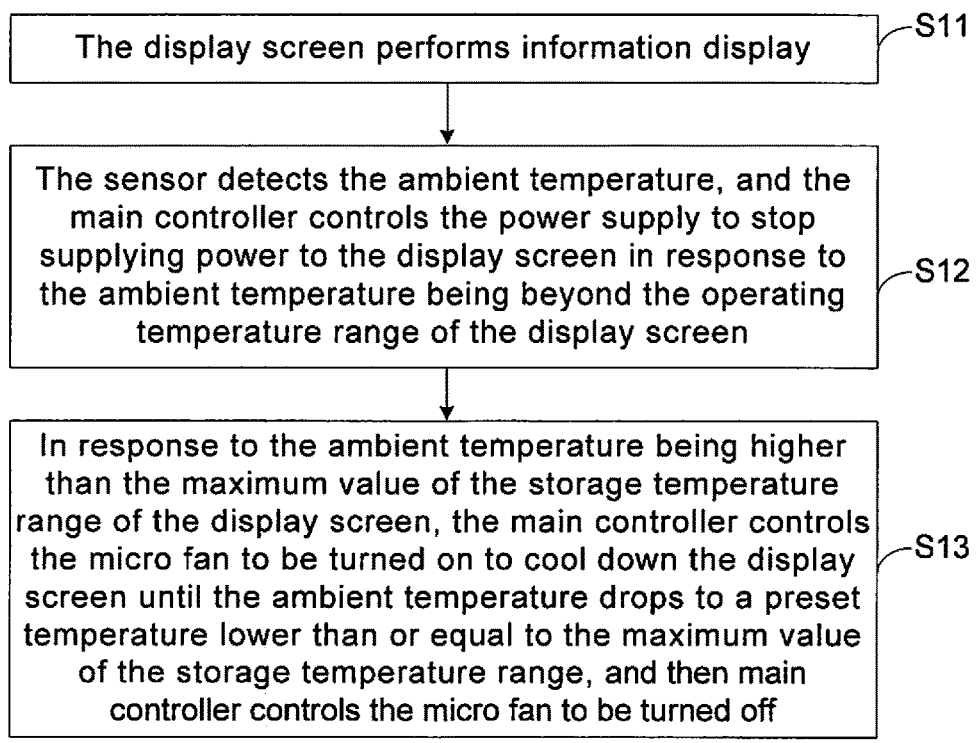
FIG. 12 is a schematic flowchart of an operation method of an electronic tag, according to some embodiments of the present disclosure.

In a case where the operation method of the electronic tag only includes S30, S32, and S35 shown in FIG. 13, the above operation method of the electronic tag may be simplified to include step 11 (S11) to step 13 (S13) shown in FIG. 12.

In S11, the display screen 12 performs information display.

For example, the electronic tags in some embodiments of the present disclosure may be applied to automobiles as vehicle-mounted electronic tags. Therefore, information displayed on the display screen 12 may include at least one of the vehicle annual inspection information, the environmental protection information, and the vehicle insurance information.

In S12, the sensor 13 detects the ambient temperature, and the main controller 14 controls the power supply 40 to stop supplying power to the display screen 12 in response to the ambient temperature being beyond the operating temperature range of the display screen 12.

In S13, in response to the ambient temperature being higher than the maximum value of the storage temperature range of the display screen, the main controller 14 controls the micro fan 15 to be turned on to cool down the display screen 12 until the ambient temperature drops to a preset temperature lower than or equal to the maximum value of the storage temperature range, and then main controller 14 controls the micro fan 15 to be turned off.

The operation method of the electronic tag provided by some embodiments of the present disclosure may be used to determine whether the ambient temperature is beyond the operating temperature range of the display screen 12 or even the storage temperature range by detecting the ambient temperature through the sensor 13. Once the ambient temperature is beyond the operating temperature range, the power supplied to the display screen 12 is shut off. In a case where the ambient temperature is higher than the maximum value of the storage temperature range, the micro fan 15 is turned on to cool down the display screen 12. The electronic tag may also be cooled down in the process of cooling down the display screen 12, so that the electronic tag may be effectively protected in an outdoor environment with a high temperature.

The electronic tag involved in the operation method of the electronic tag provided by some embodiments of the present disclosure includes the electronic tag body 10, the mounting base 20, and the bendable connecting rod 30. One end of the bendable connecting rod 30 is fixedly connected to the mounting base 20, and another end is fixedly connected to the electronic tag body 10. The electronic tag body 10 includes the sensor 13, the main controller 14, the micro fan 15, the flash memory 16, the transceiver 17, the clock circuit 18 and the activation button 50. A Bluetooth transceiver is integrated in the main controller 14. Based on this, the electronic tag further includes the power supply 40.

In some embodiments of the present disclosure, all or some steps in the above method embodiments may be realized by hardware related to program instructions, and the program may be stored in a computer readable storage medium. The steps included in the above method embodiments are performed when the program is executed. The storage medium includes any media capable of storing program codes, such as a read-only memory (ROM), a random-access memory (RAM), a magnetic disk, or an optical disk.

The forgoing descriptions are merely specific implementation manners of some embodiments of the present disclosure, but the protection scope of the present disclosure is not limited thereto. Any person skilled in the art could readily conceive of changes or replacements within the technical scope of the present disclosure, which shall be included in the protection scope of the present disclosure. Therefore, the protection scope of the present disclosure shall be subject to the protection scope of the claims.

What is claimed is:

1. An electronic tag, comprising an electronic tag body, wherein the electronic tag body includes:
   a housing;
   a display screen configured to display information; and
   a sensor and a main controller that are disposed in the housing, wherein the sensor is configured to detect an ambient temperature of an environment in which the electronic tag body is located, and the main controller is configured to shut off power supplied to the display screen in response to the ambient temperature detected by the sensor being beyond an operating temperature range of the display screen;
   wherein the electronic tag body further includes a heat dissipation device disposed in the housing; and
   the main controller is further configured to:
      turn on the heat dissipation device in response to the ambient temperature being higher than a maximum value of a storage temperature range of the display screen, so as to cool down the display screen, until the ambient temperature drops to a preset temperature lower than or equal to the maximum value of the storage temperature range; and
      turn off the heat dissipation device.

2. The electronic tag according to claim 1, further comprising a mounting base and a bendable connecting rod, wherein one end of the bendable connecting rod is fixedly connected to the mounting base, and another end of the bendable connecting rod is fixedly connected to the electronic tag body.

3. The electronic tag according to claim 2, further comprising a power supply configured to supply power to the electronic tag body; wherein
   the power supply includes a solar panel, a charging circuit, a lithium-ion battery and a DC-DC converter;
   the solar panel is connected to the lithium-ion battery through the charging circuit; and
   each of the solar panel and the lithium-ion battery is connected to an input terminal of the DC-DC converter through a diode.

4. The electronic tag according to claim 3, further comprising a switch circuit, wherein
   the main controller is configured to control the power supply to supply power to the display screen through the switch circuit; or
   the main controller is configured to control the power supply to supply power to a heat dissipation device through the switch circuit; or
   the main controller is configured to control the power supply to supply power to the display screen and the heat dissipation device through the switch circuit.

5. The electronic tag according to claim 1, wherein the electronic tag body further includes a transceiver and a flash memory that are disposed in the housing;
   the transceiver is configured to communicate with a communication host to obtain display information sent by the communication host;
   the flash memory is configured to at least store the display information sent by the communication host; and
   the display screen is configured to display information obtained from the flash memory under control of the main controller.

6. The electronic tag according to claim 5, wherein the transceiver is a Bluetooth transceiver; and the Bluetooth transceiver is integrated in the main controller.

7. The electronic tag according to claim 1, wherein the display screen is an electronic paper display screen.

8. The electronic tag according to claim 7, wherein the electronic tag body further includes a clock circuit disposed in the housing; and
   the main controller is further configured to control the electronic tag body to enter a sleep state, and periodically wake up the electronic tag body through the clock circuit after the electronic tag body enters the sleep state, so that the electronic tag body is in a normal working state.

9. The electronic tag according to claim 8, further comprising an activation button, wherein
   the main controller is further configured to wake up the electronic tag body from the sleep state in response to the activation button being pressed.

10. The electronic tag according to claim 1, further comprising at least one indicator light, wherein
   Each indicator light is connected to the main controller and is configured to perform at least one operation of temperature alarm, power alarm and deep sleep state prompt under control of the main controller.

11. The electronic tag according to claim 1, wherein the sensor is a temperature and humidity sensor.

12. An operation method of the electronic tag according to claim 1, the method comprising:
 detecting, by the sensor, the ambient temperature; and
 shutting off, by the main controller, power supplied to the display screen in response to the ambient temperature being beyond the operating temperature range of the display screen;
 wherein the electronic tag body further includes a heat dissipation device disposed in the housing; and the method further comprises:
 in response to the ambient temperature being higher than a maximum value of a storage temperature range of the display screen, controlling, by the main controller, the heat dissipation device to be turned on to cool down the display screen; and
 upon the ambient temperature dropping to a preset temperature lower than or equal to the maximum value of the storage temperature range, turning off, by the main controller, the heat dissipation device.

13. The operation method of the electronic tag according to claim 12, wherein the electronic tag body further includes a transceiver and a flash memory that are disposed in the housing; and the method further comprises:
 receiving, by the transceiver, display information sent by a communication host;
 storing, by the flash memory, at least latest display information sent by the communication host; and
 displaying, by the display screen, the stored latest display information obtained from the flash memory.

14. The operation method of the electronic tag according to claim 13, further comprising: performing an initialization, by the main controller, on the electronic tag after the electronic tag is powered; wherein
 in a case where the display screen is an electronic paper display screen, the initialization includes performing an initialization on the display screen, wherein
 performing the initialization on the display screen includes:
 detecting, by the main controller, whether there is display information stored in the flash memory;
 controlling, by the main controller, the power supply to stop supplying power to the display screen if there is no display information stored in the flash memory; and otherwise,
  obtaining, by the main controller, the display information from the flash memory;
  writing, by the main controller, the display information into a video memory of the display screen for display; and
  controlling, by the main controller, the power supply to stop supplying power to the display screen after the display screen perform a normal display.

15. The operation method of the electronic tag according to claim 14, further comprising:
 after the initialization is performed on the electronic tag, within a predetermined time:
 in response to the transceiver not establishing connection with the communication host, controlling, by the main controller, the electronic tag body to enter a sleep state; and
 in response to the transceiver establishing connection with the communication host and the transceiver receiving the display information sent by the communication host:
  storing, by the main controller, the display information in the flash memory;
  displaying, by the main controller, the display information through the display screen; and
  controlling, by the main controller, the transceiver to disconnect from the communication host, so that the electronic tag body enters a sleep state.

16. The operation method of the electronic tag according to claim 15, wherein the electronic tag body further includes a clock circuit disposed in the housing; and the method further comprises:
 waking up, by the main controller, the electronic tag body periodically through the clock circuit after the electronic tag body is in the sleep state, so that the electronic tag body is in a normal working state, wherein
 in a case where the electronic tag body is periodically woken up, in response to the ambient temperature detected by the sensor being beyond the operating temperature range of the display screen, and the transceiver receiving the display information sent by the communication host, the main controller obtains the stored latest display information from the flash memory after the ambient temperature is within the operating temperature range of the display screen and the electronic tag body is woken up, so as to display the stored latest display information on the display screen.

17. The operation method of the electronic tag according to claim 15, wherein the electronic tag body further includes an activation button; and the method further comprises:
 in response to the activation button being pressed, waking up, by the main controller, the electronic tag body from the sleep state;
 after the electronic tag body is woken up from the sleep state through the activation button, within the predetermined time:
 in response to the transceiver not establishing connection with the communication host, entering, by the electronic tag body, a sleep state; and
 in response to the transceiver establishing connection with the communication host and the transceiver receiving the display information sent by the communication host:
  storing, by the main controller, the display information in the flash memory;
  displaying, by the main controller, the display information through the display screen; and
  controlling, by the main controller, the transceiver to disconnect from the communication host, so that the electronic tag body enters a sleep state.

18. The operation method of the electronic tag according to claim 12, wherein the electronic tag body further includes at least one indicator light; and the method further comprises:
 in response to a battery level being lower than a threshold value, performing, by the at least one indicator light, a battery level warning prompt;
 in response to the ambient temperature being beyond a storage temperature range, performing, by the at least one indicator light, a temperature warning prompt; and,
 in response to the electronic tag body being in a sleep state, performing, by the at least one indicator light, a sleep state prompt.

* * * * *